(12) United States Patent
Komuro

(10) Patent No.: US 6,448,147 B2
(45) Date of Patent: Sep. 10, 2002

(54) SEMICONDUCTOR DEVICE AND METHOD FOR MANUFACTURING THE SAME

(76) Inventor: Masahiro Komuro, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 105 days.

(21) Appl. No.: 09/886,705

(22) Filed: Jun. 21, 2001

Related U.S. Application Data

(62) Division of application No. 09/281,111, filed on Mar. 29, 1999, now Pat. No. 6,288,452.

(30) Foreign Application Priority Data

Mar. 27, 1998 (JP) .......................................... 10-100483

(51) Int. Cl.[7] .............................................. H01L 21/76
(52) U.S. Cl. ........................ 438/401; 257/283; 257/797
(58) Field of Search ........................ 428/401; 287/283, 287/797

(56) References Cited

U.S. PATENT DOCUMENTS

| | | | | |
|---|---|---|---|---|
| 5,646,452 A | * | 7/1997 | Narimatsu | 257/797 |
| 5,760,421 A | * | 6/1998 | Takahashi et al. | 257/59 |
| 5,869,374 A | * | 2/1999 | Wu | 438/291 |
| 5,869,906 A | * | 2/1999 | Narimatsu | 257/797 |
| 5,892,291 A | * | 4/1999 | Narimatsu et al. | 257/797 |
| 5,969,428 A | * | 10/1999 | Nomura et al. | 257/797 |
| 6,054,721 A | * | 4/2000 | Milor | 257/48 |
| 6,165,656 A | * | 12/2000 | Tomimatu | 430/22 |
| 6,184,104 B1 | * | 2/2001 | Tan et al. | 438/401 |
| 6,215,197 B1 | * | 4/2001 | Iwamatsu | 257/797 |
| 6,218,262 B1 | * | 4/2001 | Kuroi et al. | 438/401 |
| 6,259,525 B1 | * | 7/2001 | David | 356/399 |

FOREIGN PATENT DOCUMENTS

| | | | | |
|---|---|---|---|---|
| FR | 2 767 606 | * | 1/1998 | ......... H01L/21/762 |
| JP | 64-50529 | * | 2/1989 | ......... H01L/21/30 |
| JP | 2-47821 | * | 2/1990 | ......... H01L/21/02 |
| JP | 3 138920 | * | 6/1991 | ......... H01L/21/30 |
| JP | 3-183114 | * | 8/1991 | ......... H01L/21/30 |
| JP | 8-330204 | * | 12/1996 | ......... H01L/21/027 |
| JP | 10-189425 | * | 7/1998 | ......... H01L/21/30 |

* cited by examiner

*Primary Examiner*—Charles Bowers
*Assistant Examiner*—David S. Blum

(57) ABSTRACT

As an outside box mark for automatic overlay measurement formed on a semiconductor substrate, a # shape is formed by laying two vertical lines formed by word lines over two parallel lines formed of bit lines. Thereby, a misalignment value in the word line direction and a misalignment value in the bit line direction are measured simultaneously by using one box mark. When forming capacity contacts between wiring lines of a #-shaped structure formed of word lines and bit lines, it is conducted by using a box mark for automatic overlay measurement. As a result, it becomes possible to shorten the time required for measuring the misalignment values in the X direction (word lines) and Y direction (bit lines) and analyzing the measurement result.

12 Claims, 8 Drawing Sheets

SEMICONDUCTOR DEVICE AND METHOD FOR MANUFACTURING THE SAME

This appln is a Division of Ser. No. 09/281,111, filed Mar. 29, 1999, U.S. Pat. No. 6,288,452.

BACKGROUND OF THE INVENTION

1. Field of the Invention

The present invention relates to a semiconductor device and a method for manufacturing it, and in particular to a method for manufacturing a box mark for automatic overlay measurement used in a lithography process.

2. Description of the Related Art

In semiconductor device manufacture, the lithography process is required to form each of layers of a semiconductor device in a predetermined shape. In this process, it is needed when forming a resist pattern in a certain layer to conduct it while aligning a mask pattern with its underlying layer according to a predetermined standard. The predetermined standard concerning the pattern overlay accuracy is becoming strictly as the semiconductor devices become fine.

Hereafter, a box mark for automatic overlay measurement between a mask pattern and its underlying layer used in a conventional lithography process will be described.

FIGS. 1A through 1F are sectional views for description of manufacture processes of the conventional method. FIG. 2 is a top view for description of the conventional method. Word lines and bit lines are formed on a semiconductor substrate having devices formed thereon. Thereafter, a capacity contact pattern is formed between word lines and bit lines in a lithography process. Here, the lithography process is shown.

As shown in FIG. 1A, element isolation regions 102 are first formed on a semiconductor substrate 101.

Subsequently, as shown in FIG. 1B, word lines 105 each having a polycide structure are formed. At this time, an integral outside box mark 105a for automatic misalignment measurement is also formed on a scribe line simultaneously with formation of the word lines 105.

Subsequently, as shown in FIG. 1C, pad polysilicon regions 10 are formed on predetermined areas on the word lines 105. Thereafter, an oxide film 103 having a film thickness of, for example, approximately 800 nm is deposited by using the chemical vapor deposition (CVD) method or the like. As occasion demands, reflow, silica etch back, chemical-mechanical polishing (CMP), or the like is conducted on the oxide film 103 to planarize the oxide film 103.

As shown in FIG. 1D, a resist 107 is applied to the surface of the oxide film 103. By using a mask for forming a contact hole 109 having an inside box mark 11 for automatic overlay measurement added thereto, exposure and development are conducted. Thereafter, a misalignment value from the inside box mark 11 formed over the outside box mark 105a is read by using an automatic overlay measuring instrument. Thereby, a misalignment value between the word line 105 and the contact hole 109 is measured.

In succession, the misalignment value is inputted as an offset value of an aligner. A resist 107 is applied on the surface of the oxide film 103 again, and exposure of the contact hole 109 is conducted.

Subsequently, as shown in FIG. 1E, a predetermined region of the oxide film 103 is removed, by using the photoresist 107 formed so as to have a predetermined pattern shape, as a mask, and by using anisotropic etching or the like. A contact hole 109 is thus formed. Furthermore, by way of a predetermined process, WSi is buried in the contact hole 109, and in addition, WSi serving as a bit line 111 is deposited.

Thereafter, in the same way as the word line 105, exposure and development are conducted by using a mask for forming the bit lines 111 having an integral outside box mark 111a for automatic overlay measurement added thereto. The bit lines 111 are thus formed, and the outside box mark 111a is newly formed. At this time, misalignment of the bit lines 111 is measured by using the box mark 111a formed at the time of contact described before.

Subsequently, as shown in FIG. 1F, an oxide film 150 having a film thickness of, for example, approximately 800 nm is deposited by using the chemical vapor deposition (CVD) method or the like. As occasion demands, reflow, silica etch back, chemical-mechanical polishing (CMP), or the like is conducted on the oxide film 150 to planarize the oxide film 150.

Thereafter, a photoresist film 113 is applied to the surface of the oxide film 150. By using a mask for forming capacity contacts 114 having an inside box mark 17 for automatic overlay measurement added thereto, exposure and development are conducted. Thereafter, by using the automatic overlay measuring instrument, a misalignment value in the X direction (the lateral direction of FIGS. 1A through 1F) is read from the outside box mark 105a formed in the process of FIG. 1B, and a misalignment value in the Y direction (the depth direction of FIGS. 1A through 1F) is read from the outside box mark 111a formed in the process of FIG. 1E. Between wiring lines forming the shape of #, the capacity contacts 114 are thus formed.

In the above described integral outside box mark for automatic overlay measurement, however, two box marks are required to measure the misalignment values in the X direction (word line) and Y direction (bit line) when forming capacity contacts between word lines and between bit lines. Therefore, there is a problem that it takes a time to measure the misalignment values and analyze the measurement results.

SUMMARY OF THE INVENTION

An object of the present invention is to provide a method for shortening, in the manufacture processes of a semiconductor device, the time for measuring the overlay between the underlying layer and a mask pattern at the time of lithography, and the time for analyzing the measurement result.

A semiconductor device according to the present invention has such patterns of a plurality of layers formed on a substrate that respective layers are laminated in predetermined position relations. In the present invention, a first mark disposed at the time of first pattern formation and a second mark disposed at the time of second pattern formation form one misalignment measurement mark, and position aligning for third or subsequent pattern formation is conducted with the misalignment measurement mark.

In accordance with another aspect of the present invention, a semiconductor device includes: a first mark forming a part of a misalignment measurement mark disposed in a predetermined position of a substrate at the time of first pattern formation; and a second mark forming another part of said misalignment measurement mark disposed at the time of second pattern formation, wherein the first mark and the second mark form one of the misalignment measurement mark, and the misalignment measurement mark is used for position aligning with a mark of mask side at the time of third or subsequent pattern formation.

A manufacture method according to the present invention, said semiconductor device having such patterns of a plurality of layers formed on a substrate that respective layers are laminated in predetermined position relations, includes the steps of: forming a first mark in a predetermined position of the substrate at the time of first pattern formation, the first mark forming a part of a misalignment measurement mark used in a subsequent pattern forming step; forming a second mark forming another part of said misalignment measurement mark at the time of second pattern formation; and positioning and adjusting a mark of mask side at the time of third or subsequent pattern formation by using the misalignment measurement mark produced in previous pattern forming process, and conducting third pattern formation or subsequent pattern formation.

In accordance with a method for manufacturing a semiconductor device according to the present invention, a # shape is formed by laying two vertical lines formed by word lines over two parallel lines formed of bit lines, as an outside box mark for automatic overlay measurement formed on a semiconductor substrate. Thereby, a misalignment value from the word line and a misalignment value from the bit line can be measured by using one box mark. As a result, it becomes also possible to shorten the time required for measuring the misalignment values and analyzing the measurement result. Furthermore, by using a #-shaped box mark of slit type, the measurement accuracy can be further improved.

DESCRIPTION OF THE PREFERRED EMBODIMENTS

Hereafter, preferred embodiments of the present invention will be described concretely by referring to accompanying drawing. FIGS. 3A through 3F are sectional views showing a method for manufacturing a semiconductor device according to a first embodiment of the present invention in the order of process. FIG. 4 is its plan view. A method for manufacturing a semiconductor device having at least three wiring layers laminated on a substrate includes the steps of disposing outside box mark (word lines) 205a extending in one direction in a predetermined position when forming the word lines 205, disposing outside box mark (bit lines) 211a extending in a direction perpendicular to the outside box mark (word lines) when forming the bit lines 211, thereby forming one misalignment measurement mark 205a and 211a, disposing an inside box mark 27 on the substrate by using a mask for forming capacity contacts, measuring misalignment values of the misalignment measurement mark and the inside box mark, inputting the values to the aligner as offset values, and forming a pattern of the capacity contacts 214.

In the same way as the conventional example, the first embodiment shows a lithography process for forming a pattern of capacity contacts 214 arranged between word lines 205 and bit lines 211, after the word lines and the bit lines 211 have been formed on a semiconductor substrate 201 having elements formed thereon.

Figure 1A:
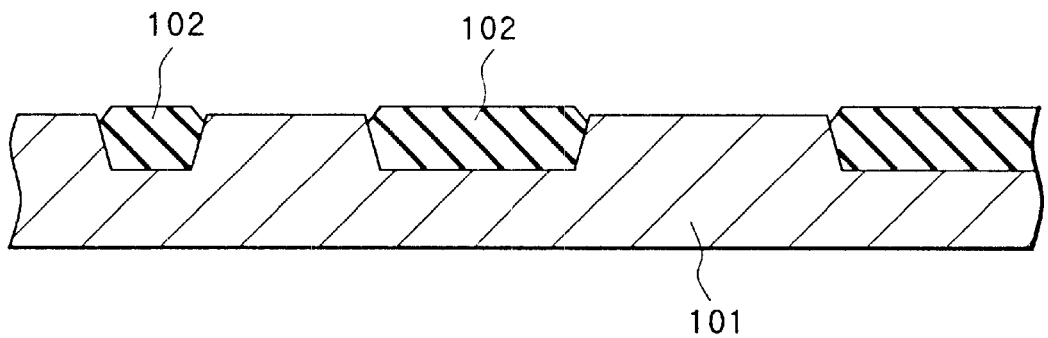
FIGS. 1A through 1F are sectional views showing a conventional method for manufacturing a semiconductor device in the order of process.
Figure 1B:
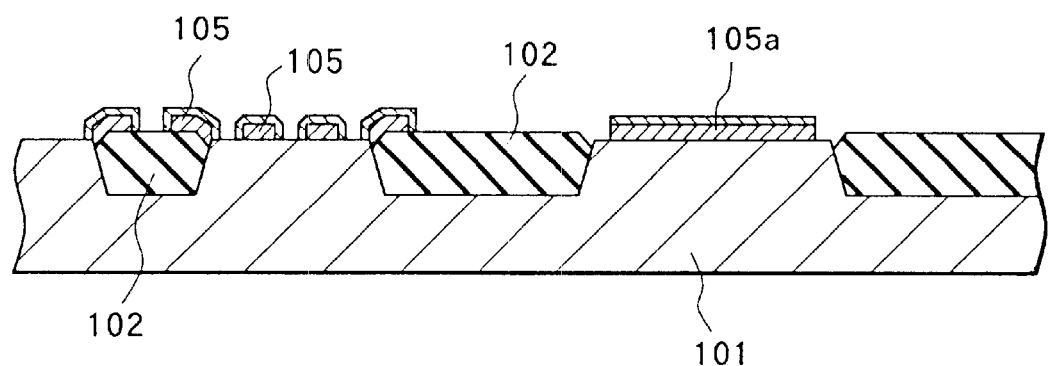
Figure 1C:
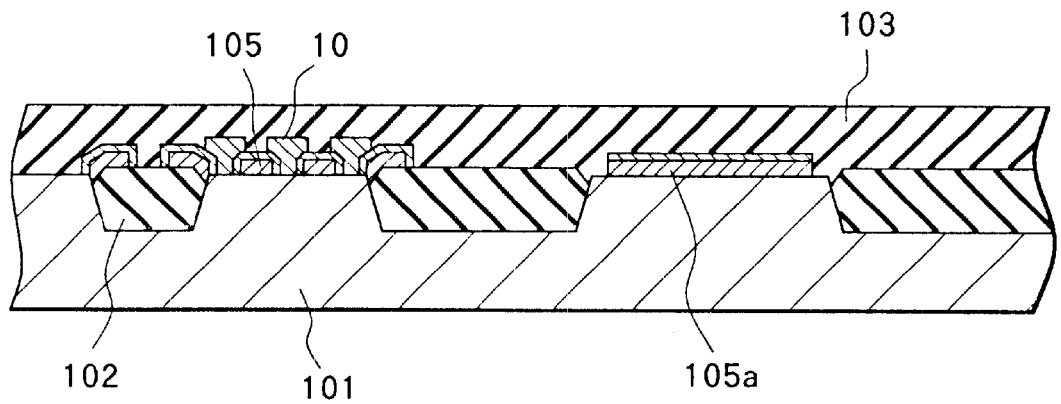
Figure 1D:
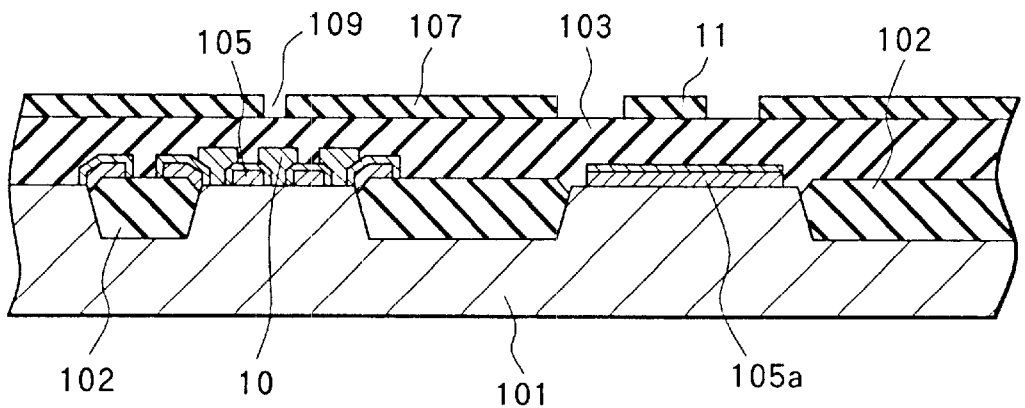
Figure 1E:
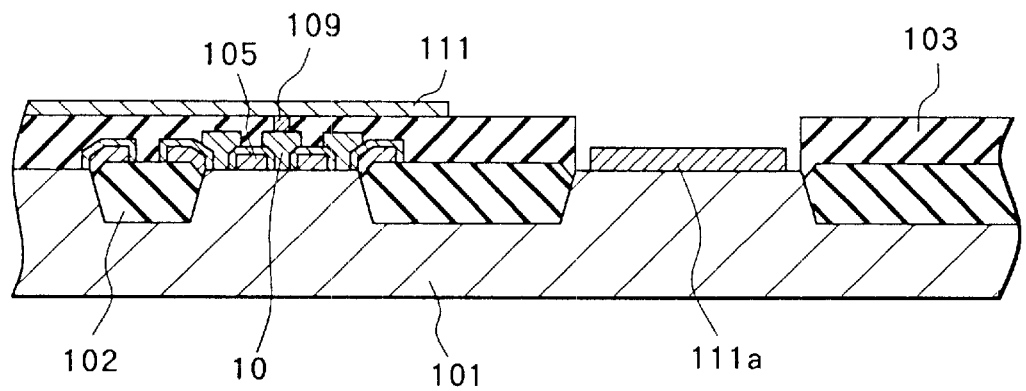
Figure 1F:
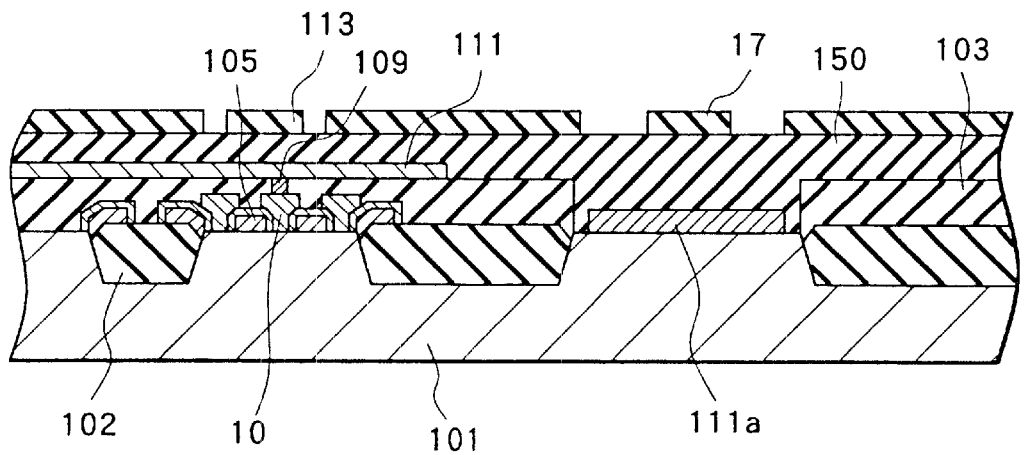
Figure 2:
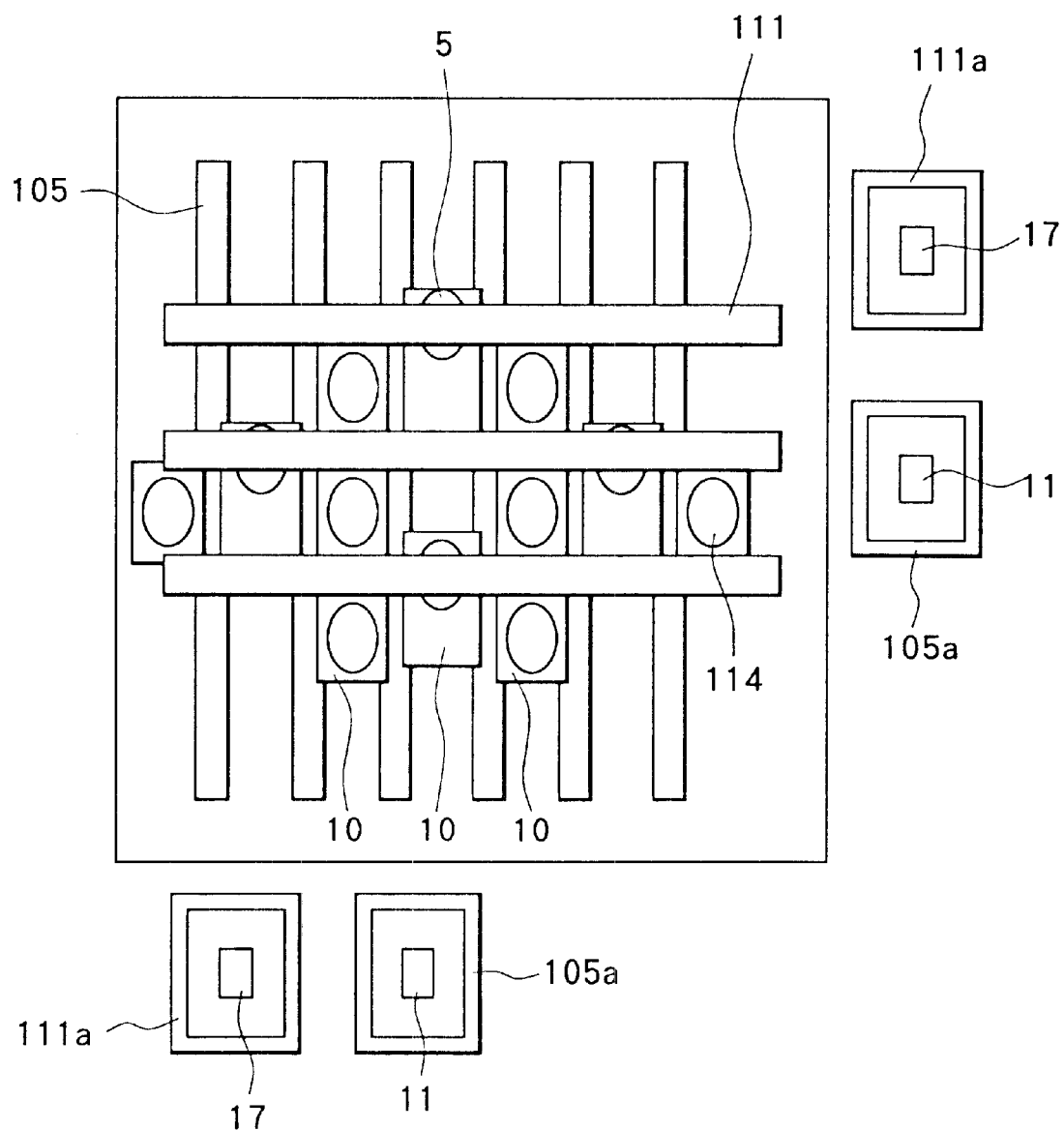
FIG. 2 is a plan view showing a conventional semiconductor device.
Figure 3A:
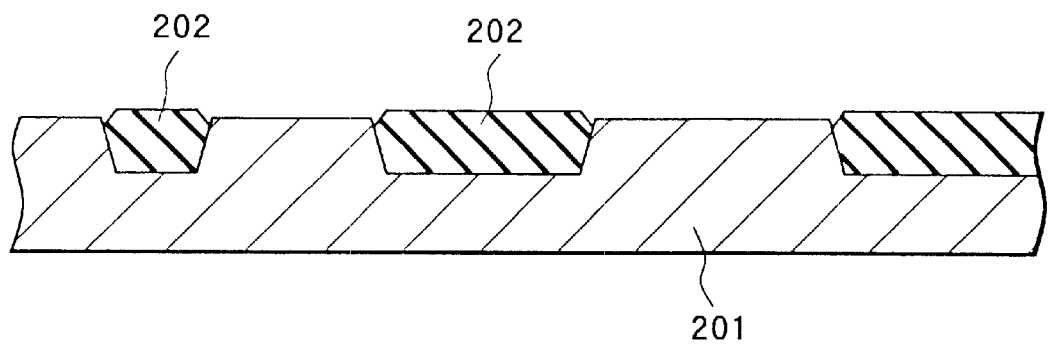
FIGS. 3A through 3F are sectional views showing a method for manufacturing a semiconductor device according to a first embodiment of the present invention in the order of process.
Figure 4:
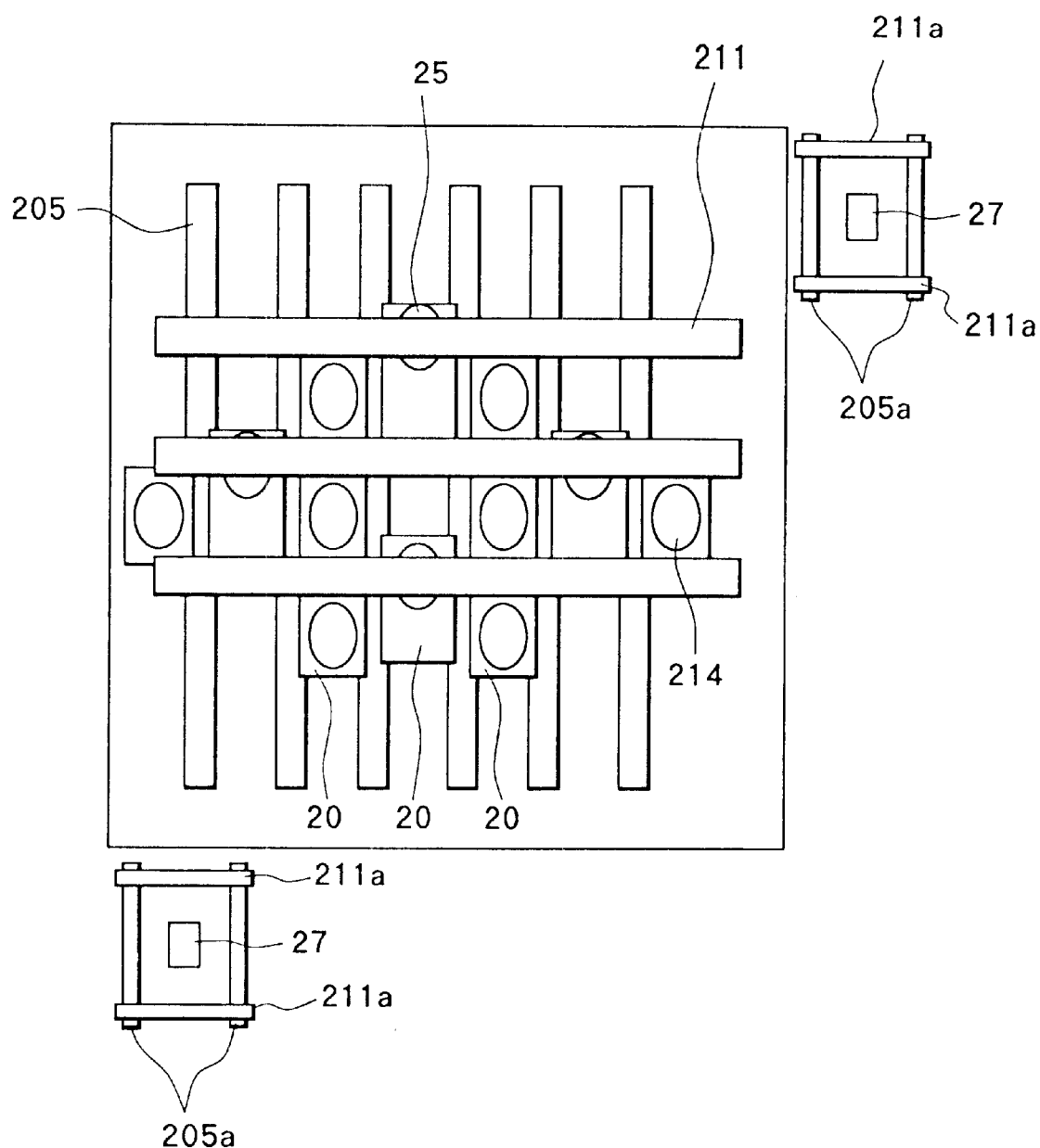
FIG. 4 is a plan view showing a method for manufacturing a semiconductor device according to the first embodiment of the present invention.

As shown in FIG. 3A, device isolation regions 202 are first formed on the semiconductor substrate 201.

Figure 3B:
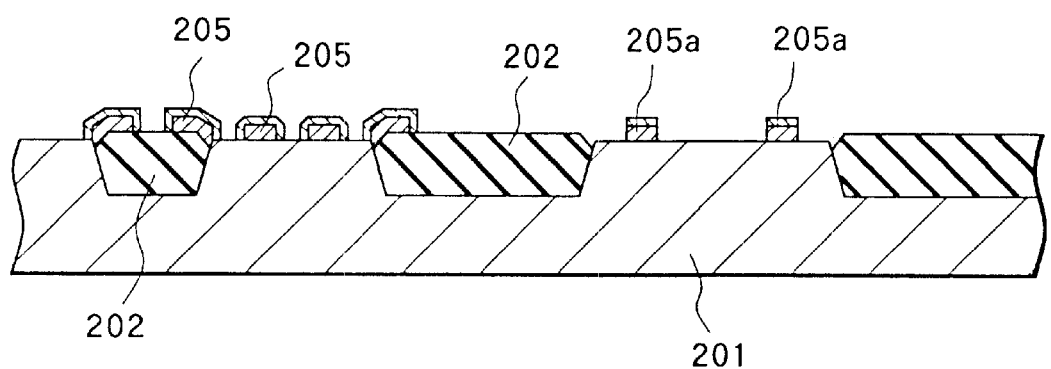

Subsequently, as shown in FIG. 3B, word lines 205 each having a polycide structure are formed. At this time, an outside box mark (word lines) 205a for automatic misalignment measurement is also formed on scribe lines 204 simultaneously with formation of the word lines 205.

Figure 3C:
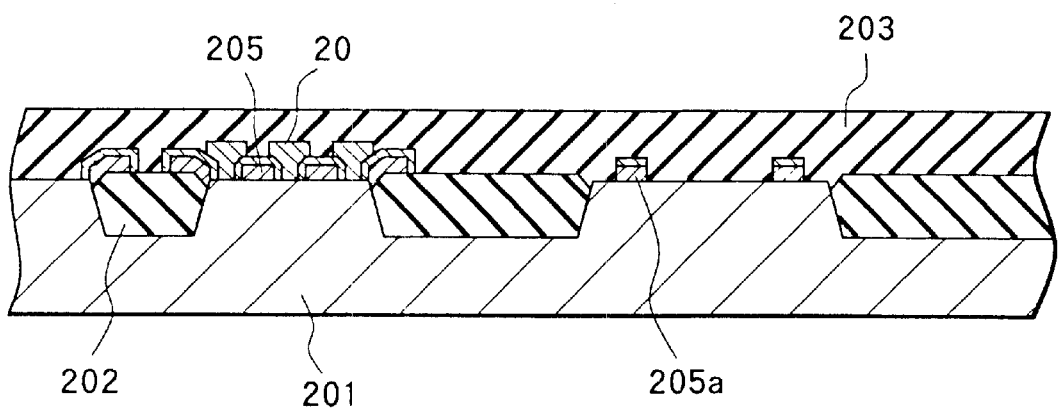

Thereafter, as shown in FIG. 3C, pad polysilicon regions 20 are formed on predetermined areas on the word lines 205. Thereafter, an oxide film 203 having a film thickness of, for example, approximately 800 nm is deposited by using the chemical vapor deposition (CVD) method or the like. As occasion demands, reflow, silica etch back, chemical-mechanical polishing (CMP), or the like is conducted on the oxide film 203 to planarize the oxide film 203.

Figure 3D:
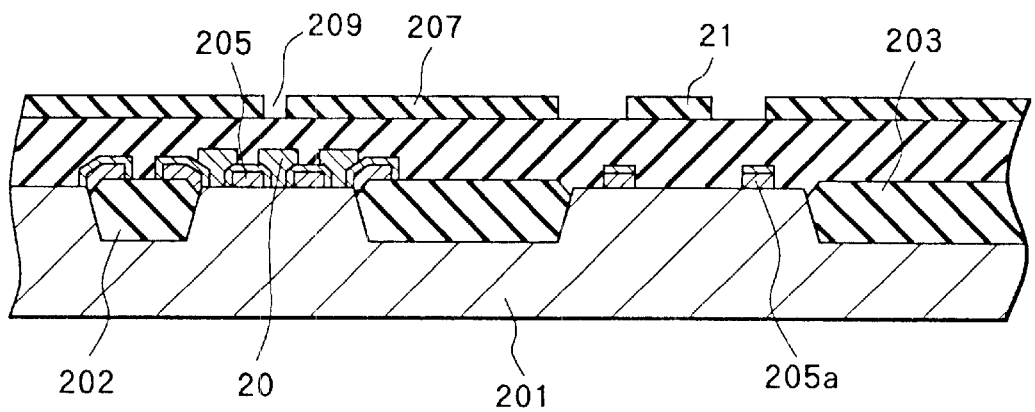

As shown in FIG. 3D, a resist 207 is applied to the surface of the oxide film 203. By using a mask for forming a contact hole 209 having an inside box mark 21 for automatic overlay measurement added thereto, exposure and development are conducted. Thereafter, a misalignment value from the inside box mark 21 formed over the outside box mark (word lines) 205a is read by using an automatic overlay measuring instrument. Thereby, a misalignment value between the word line 205 and the contact hole 209 is measured.

In succession, the misalignment value is inputted as an offset value of an aligner. A resist 207 is applied on the surface of the oxide film 203 again, and exposure of the contact hole 209 is conducted.

Figure 3E:
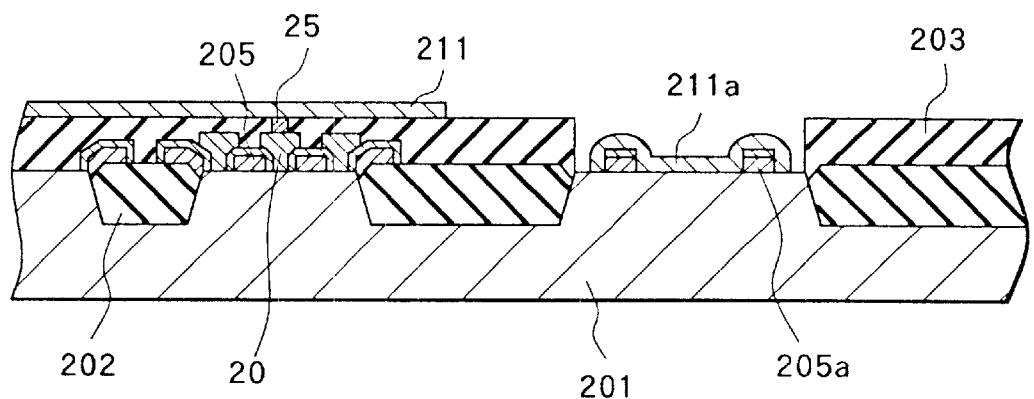

Subsequently, as shown in FIG. 3E, a predetermined region of the oxide film 203 is removed, by using the photoresist 207 formed so as to have a predetermined pattern shape, as a mask, and by using anisotropic etching or the like. A contact hole 25 is thus formed. Furthermore, by way of a predetermined process, WSi is buried in the contact hole 25, and in addition, WSi serving as a bit line 211 is deposited.

Thereafter, in the same way as the word line 205, exposure and development are conducted by using a mask for forming the bit lines having an outside box mark (bit lines) 211a for automatic overlay measurement added thereto. The bit lines 211 are thus formed, and in addition the outside box mark (bit lines) 211a is formed so as to overlie the outside box mark 205a formed of word lines. At this time, misalignment of the bit lines 211 is measured by using the outside box mark (bit lines) 211a formed at the time of contact described before.

Figure 3F:
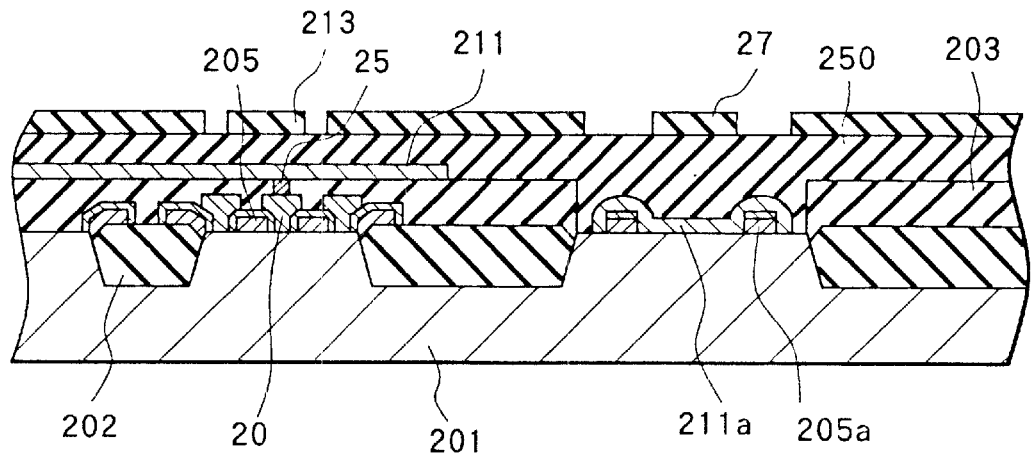

Subsequently, as shown in FIG. 3F, an oxide film 250 having a film thickness of, for example, approximately 800 nm is deposited by using the chemical vapor deposition (CVD) method or the like. As occasion demands, reflow, silica etch back, chemical-mechanical polishing (CMP), or the like is conducted on the oxide film 250 to planarize the oxide film 250.

Thereafter, a photoresist film 213 is applied to the surface of the oxide film 250. By using a mask for forming capacity contacts having an inside box mark 213a for automatic overlay measurement added thereto, exposure and development are conducted by using a mask for forming capacity contacts. Thereafter, by using the automatic overlay measuring instrument, the #-shaped outside box mark (205a and 211a) formed of the word lines 205 and the bit lines 211, and the inside box mark 213a are measured. Thereby, a misalignment value in the X direction (the lateral direction of FIGS. 3A through 3F) is read from the outside box mark 205a formed of the word lines, and a misalignment value in the Y direction (the depth direction of FIGS. 3A through 3F) is read from the outside box mark 211a formed of the bit lines 211. Between wiring lines forming the shape of #, the capacity contacts 214 are thus formed.

By referring to FIGS. 5A through 5F, a second embodiment of the present invention will now be described.

Processes in the second embodiment are basically the same as those in the first embodiment. Principally, changed points will now be described.

Figure 5A:
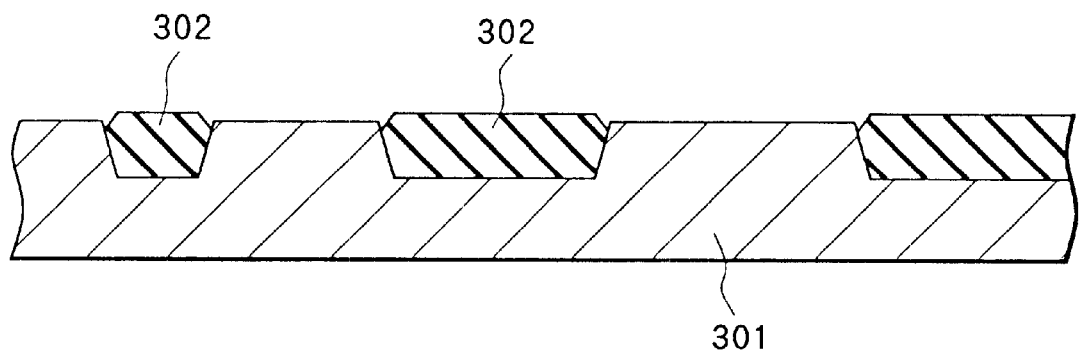
FIGS. 5A through 5F are sectional views showing a method for manufacturing a semiconductor device according to a second embodiment of the present invention in the order of process.
Figure 5B:
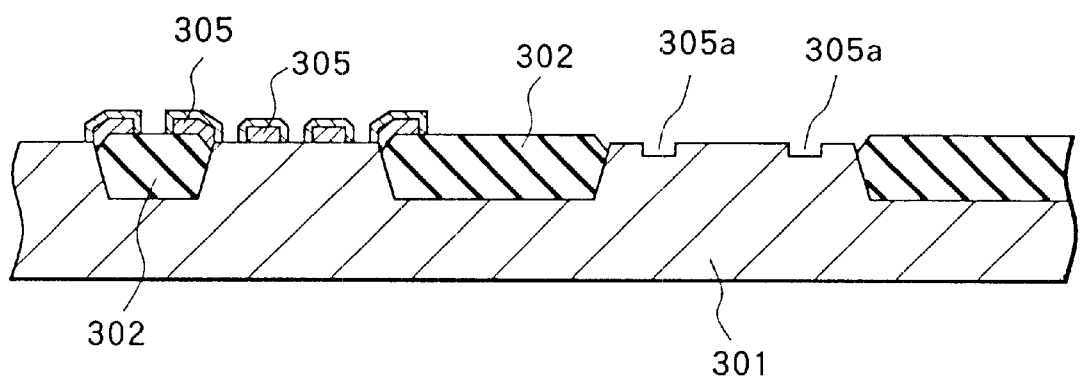
Figure 5C:
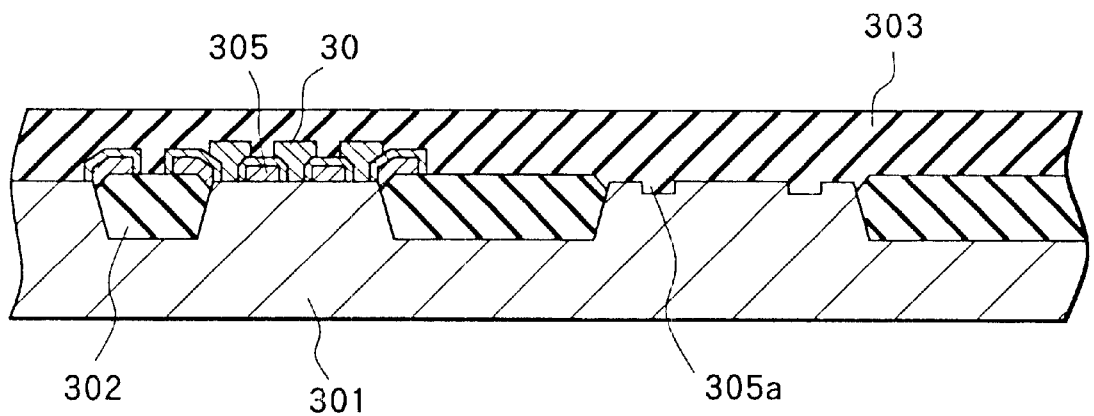

In the second embodiment, device isolation regions 302 are formed on a semiconductor substrate 301 in the same way as FIG. 3A, and thereafter an outside box mark (word lines) 305a of slit type for automatic overlay measurement is formed on scribe lines simultaneously with formation of the word lines 305 as shown in FIG. 5B.

Thereafter, pad polysilicon regions 30 and an oxide film 303 are formed in the same way as FIGS. 3C through 3D.

Figure 5D:
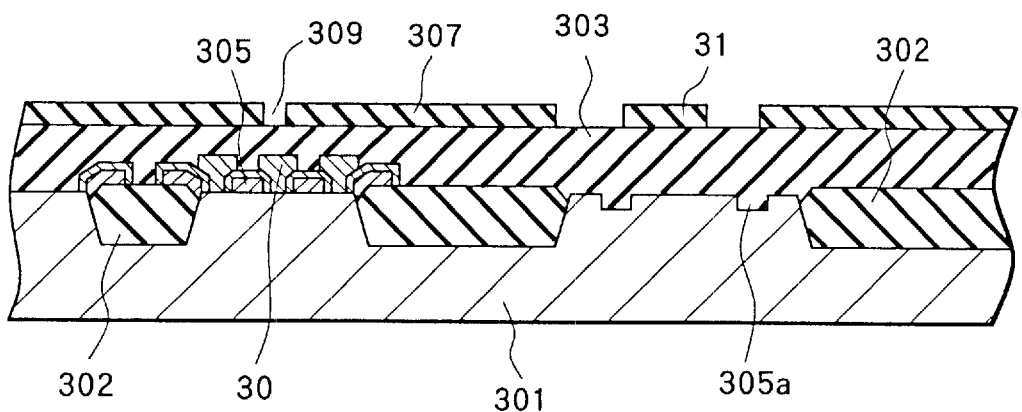
Figure 5E:
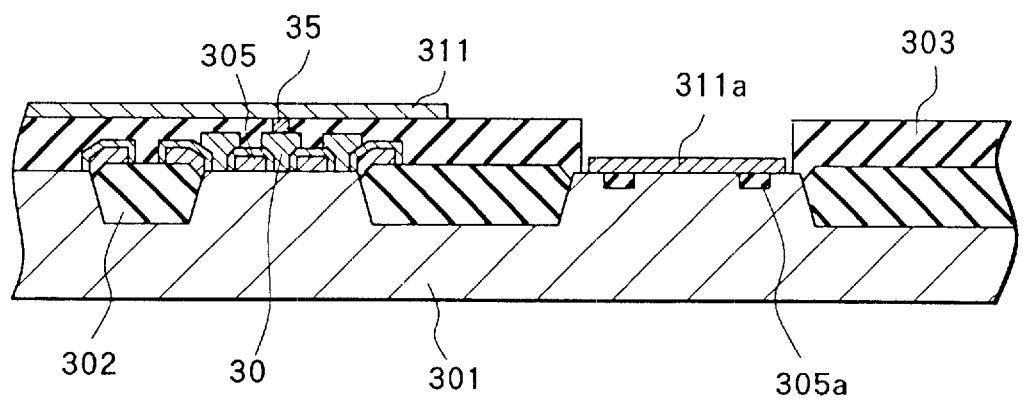
Figure 5F:
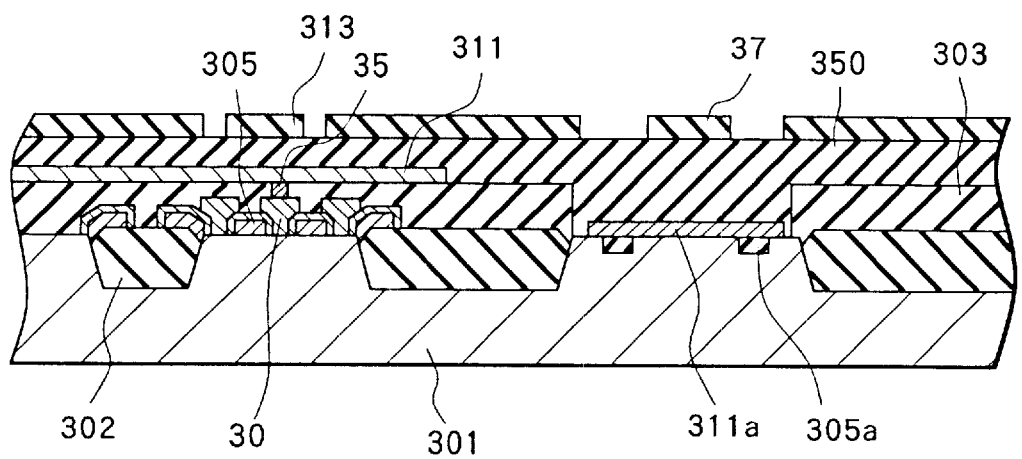

By using a resist 307 formed in a predetermined shape, as a mask, a predetermined area of the oxide film 303 is removed by anisotropic etching or the like and a contact hole 35 is formed as shown in FIGS. 5D and 5E.

At this time, the oxide film 303 is buried in the outside box mark (word lines) 305a of slit type for automatic overlay measurement formed on the scribe lines simultaneously with the word lines 305. Thereafter, exposure and development are conducted by using a bit line forming mask having an outside box mark (bit lines) 311a for automatic overlay measurement added thereto. Thus, bit lines 311 are formed, and in addition, the outside box mark (bit lines) 311a is formed so as to overlie the outside box mark (word lines) 305a of slit type formed of the word lines 305.

As a result, edges of a #-shaped box mark formed by the outside box mark (word lines) 305a of slit type and outside box mark (bit lines) 311a become sharp. And the overlay measurement accuracy of the automatic overlay measuring instrument is improved.

Furthermore, by changing the outside box mark (bit lines) 311a as well to a box mark of slit type, a further improvement of the measurement accuracy can be expected.

In the embodiments heretofore described, capacity contacts formed between word lines and between bit lines have been described. However, it can be applied between other processes as well in the same way.

What is claimed is:

1. A method for manufacturing a semiconductor device, said semiconductor device having such patterns of a plurality of layers formed on a substrate that respective layers are laminated in predetermined position relations, said method comprising the steps of:

forming a first mark in a predetermined position of said substrate at the time of first pattern formation, said first mark forming a part of a misalignment measurement mark used in a subsequent pattern forming step;

forming a second mark at the time of second pattern formation, said second mark also being in direct contact with said semiconductor substrate and with said first mark, said second mark forming another part of said misalignment measurement mark; and positioning and adjusting a mark of mask side at the time of third or subsequent pattern formation by using said misalignment measurement mark produced in previous pattern forming process, and conducting third pattern formation or subsequent pattern formation.

2. A method for manufacturing a semiconductor device according to claim 1, wherein said first mark is formed of two line patterns extending in one direction, said second mark is formed of two line patterns extending in a direction substantially perpendicular to said first mark, and said misalignment measurement mark takes a shape of # when viewed from top of said substrate.

3. A method for manufacturing a semiconductor device according to claim 1, wherein said first mark and said second mark are provided so as to correspond to layers having word lines and bit lines formed thereon.

4. A method for manufacturing a semiconductor device according to claim 1, wherein a mark provided in a mask used for forming capacity contacts deposited on said bit lines corresponds to said #-shaped misalignment measurement mark.

5. A method for manufacturing a semiconductor device of conducting resist pattern formation for laminating layers respectively having predetermined position relations, at least three times, said semiconductor device manufacture method comprising the steps of:

(a) disposing a first mark extending in one direction, in a predetermined position at the time of first pattern formation, said first mark forming a part of a misalignment measurement mark;

(b) disposing a second mark extending in a direction different from that of said first mark at the time of second pattern formation, said second mark also being in direct contact with said semiconductor substrate and with said first mark, and thereby forming one misalignment measurement mark;

(c) disposing a third mark in such a position as to be housed in said one misalignment measurement mark on a substrate when viewed from above, by using a mask for third pattern forming;

(d) measuring a misalignment value between said misalignment measurement mark and said third mark; and (e) forming a third pattern when positioning the mask for third pattern forming, with due regard to said misalignment value measured in said step (d).

6. A method for manufacturing a semiconductor device according to claim 5, wherein said first mark is formed of two line patterns extending in one direction, said second mark is formed of two line patterns extending in a direction substantially perpendicular to said first mark, and said misalignment measurement mark takes a shape of # when viewed from top of said substrate.

7. A method for manufacturing a semiconductor device according to claim 5, wherein said first mark and said second mark are provided so as to correspond to layers having word lines and bit lines formed thereon.

8. A method for manufacturing a semiconductor device according to claim 5, wherein a mark provided in a mask used for forming capacity contacts deposited on said bit lines corresponds to said #-shaped misalignment measurement mark.

9. A method for manufacturing a semiconductor device on a substrate, said semiconductor device having at least three wiring layers laminated via insulation films between, said method comprising the steps of:
- (a) disposing a first mark extending in one direction, in a predetermined position when forming a first layer, said first mark forming a part of a misalignment measurement mark;
- (b) disposing a second mark extending in a direction different from that of said first mark when forming a second layer, said second mark also being in direct contact with said semiconductor substrate and with said first mark, and thereby forming one misalignment measurement mark;
- (c) deposing a third mark in such a position as to be housed in said one misalignment measurement mark on said substrate when viewed from above, by using a mask for forming a third layer;
- (d) measuring a misalignment value between said misalignment measurement mark and said third mark; and
- (e) forming a third layer when positioning the mask for forming a pattern of said third layer, with due regard to said misalignment value measured in said step (d).

10. A method for manufacturing a semiconductor device according to claim 9, wherein said first mark is formed of two line patterns extending in one direction, said second mark is form of two line patterns extending in a direction substantially perpendicular to said first mark, and said misalignment measurement mark takes a shape of # when viewed from top of said substrate.

11. A method for manufacturing a semiconductor device according to claim 9, wherein said first mark and said second mark are provided so as to correspond to layers having word lines and bit lines formed thereon.

12. A method for manufacturing a semiconductor device according to claim 9, wherein a mark provided in a mask used for forming capacity contacts deposited on said bit lines corresponds to said #-shaped misalignment measurement mark.

* * * * *

UNITED STATES PATENT AND TRADEMARK OFFICE
CERTIFICATE OF CORRECTION

PATENT NO.    : 6,448,147 B2
DATED         : September 10, 2002
INVENTOR(S)   : Komuro, Masahiro It is certified that error appears in the above-identified patent and that said Letters Patent is hereby corrected as shown below:

Column 8,
Line 7, "form" should be -- formed --.

Signed and Sealed this

Twenty-eighth Day of October, 2003

JAMES E. ROGAN
*Director of the United States Patent and Trademark Office*